United States Patent
Yamazaki et al.

(10) Patent No.: US 6,753,614 B2
(45) Date of Patent: Jun. 22, 2004

(54) SEMICONDUCTOR CHIP CARRYING ADHESIVE TAPE/SHEET, SEMICONDUCTOR CHIP CARRIER, AND SEMICONDUCTOR CHIP PACKAGING BODY

(75) Inventors: Osamu Yamazaki, Saitama (JP); Kazuyoshi Gbe, Shiraoka-machi (JP)

(73) Assignee: Lintec Corporation, Tokyo (JP)

( * ) Notice: Subject to any disclaimer, the term of this patent is extended or adjusted under 35 U.S.C. 154(b) by 0 days.

(21) Appl. No.: 10/107,175

(22) Filed: Mar. 28, 2002

(65) Prior Publication Data

US 2002/0140063 A1 Oct. 3, 2002

(30) Foreign Application Priority Data

Mar. 30, 2001 (JP) ........................................ 2001-099148

(51) Int. Cl.[7] .............................................. H01L 23/48
(52) U.S. Cl. ...................... 257/782; 257/783; 257/704; 438/464
(58) Field of Search ................................ 438/464, 106, 438/118, 125; 257/782–783, 704

(56) References Cited

U.S. PATENT DOCUMENTS

| 5,030,308 A | 7/1991 | Sheyon et al. |
| 5,667,073 A | 9/1997 | Okui |
| 5,976,955 A | * 11/1999 | Hodges ...................... 438/464 |
| 6,103,554 A | 8/2000 | Son et al. |

FOREIGN PATENT DOCUMENTS

| JP | 59-66153 | 4/1984 |
| WO | WO 88/03704 | 5/1988 |

* cited by examiner

*Primary Examiner*—Luan Thai
(74) *Attorney, Agent, or Firm*—Posz & Bethards, PLC

(57) ABSTRACT

A semiconductor chip carrying adhesive tape, wherein a plurality of adhesive agent portions for adhering semiconductor chips 2 are intermittently formed on a tape shaped base material 11 in the longitudinal direction of the base material 11 to have a substantially identical shape with that of the semiconductor chip 2 to be adhered or a slightly larger shape than that, and an adhesive agent constituting said adhesive agent portions 12 has gradable adhesiveness, can improve a yield of adhesive agent attached semiconductor chips 2 and prevent a wasteful use of an adhesive agent.

15 Claims, 5 Drawing Sheets

SEMICONDUCTOR CHIP CARRYING ADHESIVE TAPE/SHEET, SEMICONDUCTOR CHIP CARRIER, AND SEMICONDUCTOR CHIP PACKAGING BODY

BACKGROUND OF THE INVENTION

1. Field of the Invention

The present invention relates to a semiconductor chip carrying adhesive tape/sheet, a semiconductor chip carrier and a semiconductor chip packaging body, to be used when mounting a semiconductor chip on a lead frame, or storing, transporting or automatically taking out the semiconductor chip before the mounting, and a method of producing the semiconductor chip carrier, a method of mounting the semiconductor chip and a method of packaging the semiconductor chip.

2. Description of the Related Art

When mounting a semiconductor chip on a lead frame, processes below are performed in the related art.

(1) Grinding a back surface of a semiconductor wafer to make the semiconductor wafer have a desired thickness.

(2) Sticking an adhesive sheet to the semiconductor wafer.

(3) Sticking a wafer dicing sheet in accordance with need to fix the semiconductor wafer to a ring frame.

(4) Dicing the semiconductor wafer by a dicer.

(5) Expanding the wafer dicing sheet in accordance with need to separate the semiconductor chips obtained by the dicing.

(6) Picking up the semiconductor chip attached with an adhesive agent.

(7) Mounting the adhesive agent attached semiconductor chip on a lead frame and adhering the semiconductor chip to the lead frame via an adhesive agent.

In the method of mounting a semiconductor chip by the above processes, however, defective semiconductor chips wherein cutouts and cracks, etc. occurred at the time of dicing are also stuck to the adhesive sheet. Therefore, the yield is low and the adhesive sheets are wastefully used. Particularly, when an adhesive agent of the adhesive sheet is conductive and, for example, a large amount of a precious metal such as Ag powders, is contained in the adhesive agent, it ends up in wasting very high costs.

SUMMARY OF THE INVENTION

The present invention was made in consideration with the above circumstances and has as an object thereof to provide a semiconductor chip carrying adhesive tape and sheet capable of improving an yield of adhesive agent attached chips and preventing wasteful use of an adhesive agent, a semiconductor chip carrier, a method of producing the same, a method of mounting the semiconductor chip, a semiconductor chip packaging body, and a method of packaging the semiconductor chip by using the semiconductor chip carrying adhesive tape or sheet.

To attain the above object, according to the present invention, there is provided a semiconductor chip carrying adhesive tape, wherein a plurality of adhesive agent portions for adhering a semiconductor chip are intermittently formed on a tape shaped base material in a longitudinal direction of the base material, in a substantially identical shape with that of the semiconductor chip to be adhered or a slightly larger shape than that of the semiconductor chip to be adhered, and an adhesive agent constituting the adhesive agent portions has gradable adhesiveness (claim 1).

The semiconductor carrying adhesive tape may be wound to be a wound body. In this case, a release film may be stuck on the surface of the semiconductor chip carrying adhesive tape.

The adhesive agent which has gradable adhesiveness may have a stage of exhibiting tackiness (removable adhesiveness) and a stage of exhibiting-adhesiveness (a so-called tacky adhesive agent), or may be those which do not exhibit any tackiness/adhesiveness in a normal state but exhibit gradable tackiness/adhesiveness by a heat, compression or other triggers. Thus the adhesive agent of the adhesive agent portion has such gradable adhesiveness, sticking to a semiconductor chip and temporary/actual adhesion to a lead frame can be efficiently performed.

In the above invention (claim 1), second adhesive agent portions for adhering a cover member (here, "adhering" includes concepts of sticking and affixing) may be adhered at both end portions of the tape shaped base material so as not to contact the adhesive agent portion for adhering the semiconductor chip (claim 2).

According to the present invention, there is provided a semiconductor chip carrying adhesive sheet, wherein a plurality of adhesive agent portions for adhering semiconductor chips are formed on a sheet shaped base material, in a substantially identical shape with that of the semiconductor chips to be adhered or a slightly larger shape than the semiconductor chips to be adhered, and an adhesive agent constituting the adhesive agent portions has gradable adhesiveness (claim 3).

According to the present invention, there is provided a semiconductor chip carrier, which can be obtained by sticking a semiconductor chip to the adhesive agent portion of the semiconductor chip carrying adhesive tape according to the above invention (claims 1 and 2) or to the adhesive agent portion of the semiconductor chip carrying adhesive sheet according to the above invention (claim 3) (claims 4 and 5).

According to the present invention, there is provided a first semiconductor chip packaging body, which can be obtainable by adhering the semiconductor chip carrier according to the above invention (claim 4) and a continuous cover member on which a plurality of chip housings are intermittently formed in the longitudinal direction so that the semiconductor chips on the semiconductor chip carrier are housed in the chip housings on the cover member (claim 8), and a second semiconductor chip packaging body, which can be obtainable by adhering the semiconductor chip carrier according to the above invention (claim 5) and a tray shaped cover member on which a plurality of chip housings are formed so that the semiconductor chips on the semiconductor chip carrier are housed in the chip housings on the cover member (claim 9). Note that "adhering" here includes concepts of sticking, affixing and fusion bonding.

When using the semiconductor chip carrying adhesive tape or the semiconductor chip carrying adhesive sheet according to the present invention, since only non-defective semiconductor chips can be stuck to the adhesive agent portion for adhering the semiconductor chip of the semiconductor chip carrying adhesive tape or the semiconductor chip carrying adhesive sheet, a yield of adhesive agent attached semiconductor chips which should be mounted on a lead frame can be improved and a wasteful use of an adhesive agent can be prevented. Particularly, when the adhesive agent portion contains a conductive material made of a precious metal, such as Ag powders, costs for the adhesive agent can be considerably reduced comparing the case of sticking the adhesive agent portion allover the semiconductor wafer.

Also, in the present invention, since the adhesive agent portion formed on the base material is formed in a substantially identical shape with that of a semiconductor chip to be adhered or a slightly larger shape than that of the semiconductor chip to be adhered, there is an advantage that cutting of the adhesive agent portion is not necessary.

BRIEF DESCRIPTION OF THE DRAWINGS

These and other objects and features of the present invention will become clearer from the following description of the preferred embodiments given with reference to the attached drawings, in which.

DESCRIPTION OF THE PREFERRED EMBODIMENTS

Below, embodiments of the present invention will be explained.

First Embodiment

Figure 1:
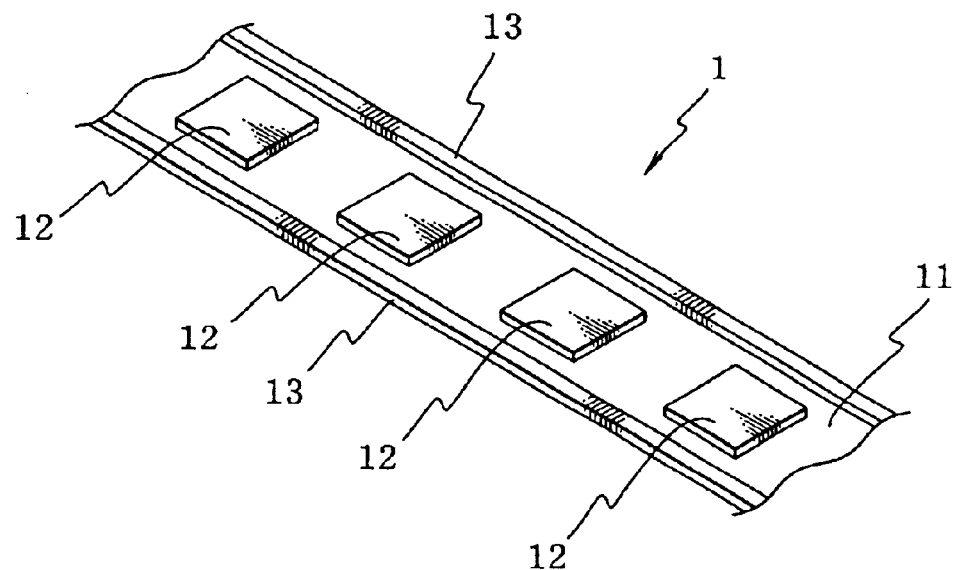
FIG. 1 is a perspective view of a semiconductor chip carrying adhesive tape according to an embodiment of the present invention.
Figure 2:
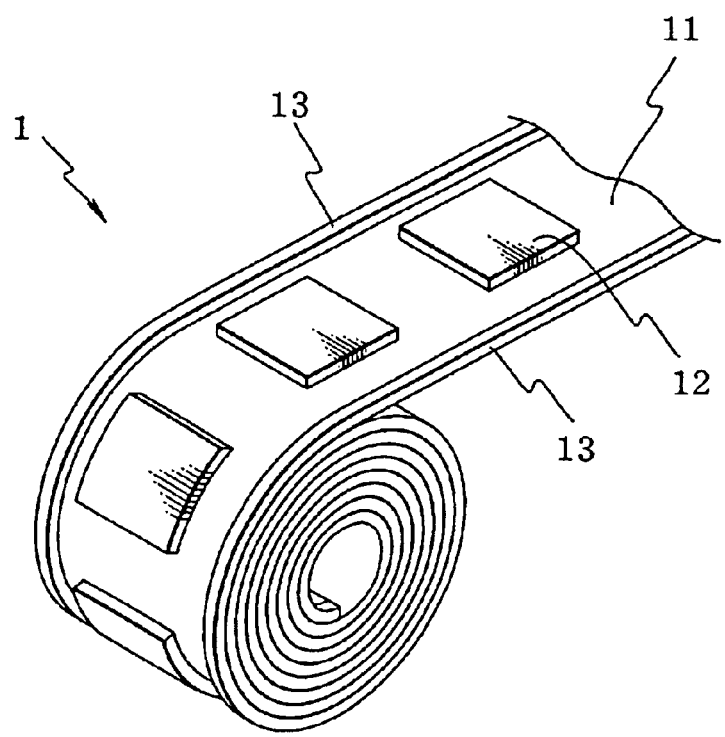
FIG. 2 is an overall perspective view of the semiconductor chip carrying adhesive tape according to the same embodiment.
Figure 3:
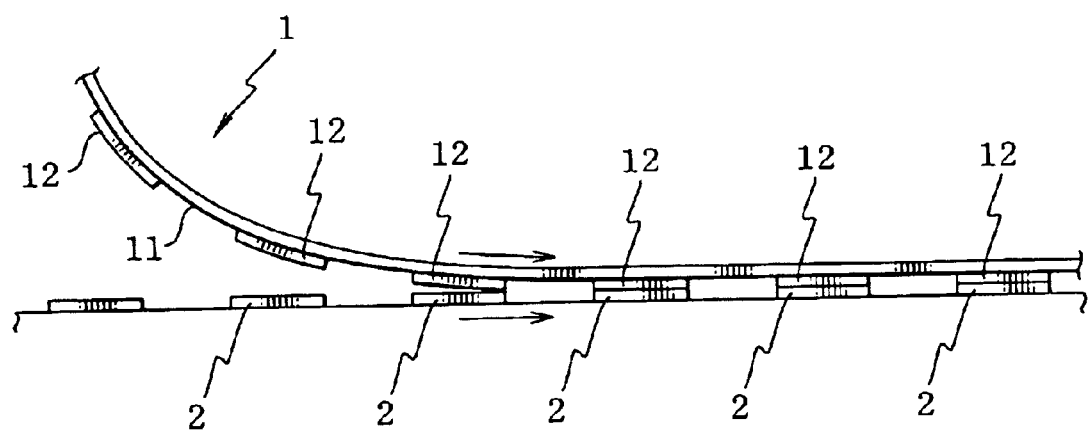
FIG. 3 is a schematic side view when sticking the semiconductor chip carrying adhesive tape according to the same embodiment and a semiconductor chip.
Figure 4:
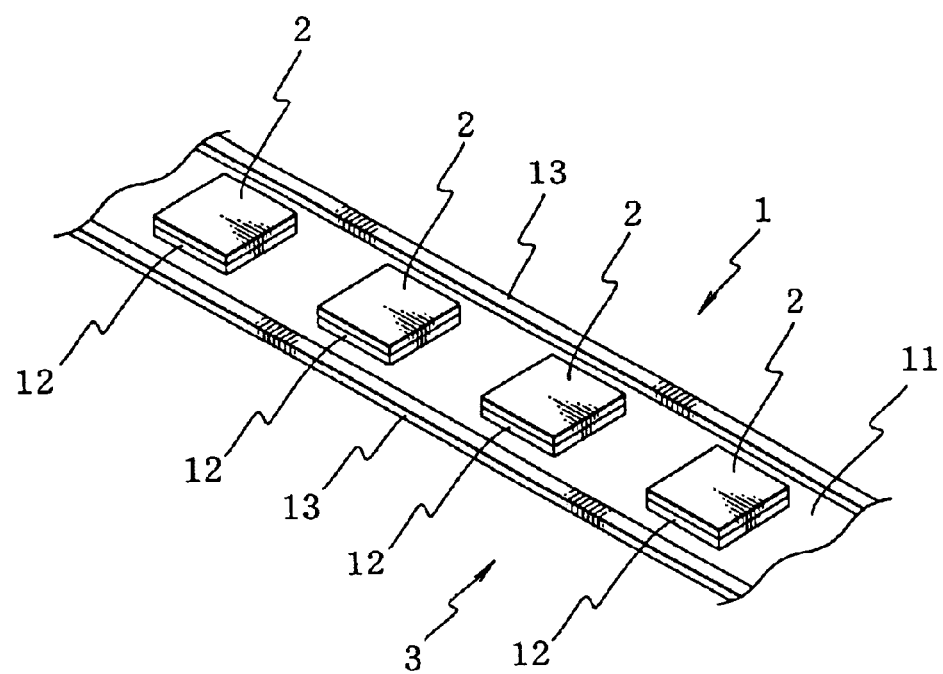
FIG. 4 is a perspective view of a semiconductor chip carrier according to the same embodiment.
Figure 5:
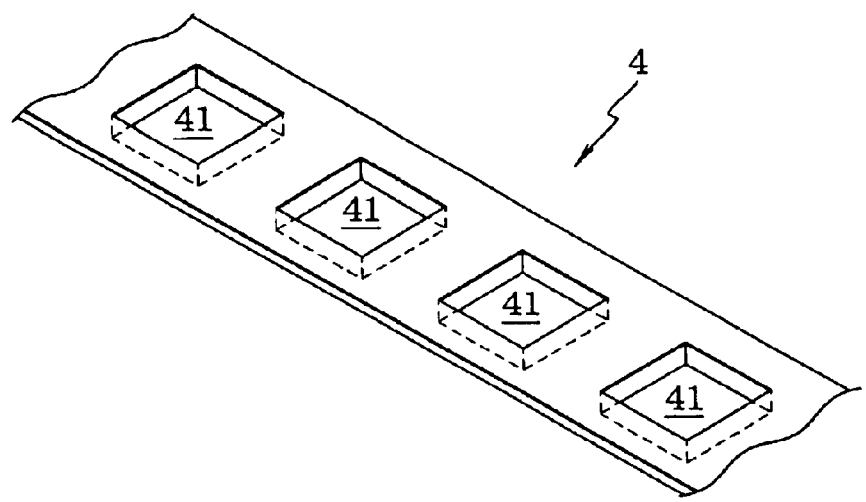
FIG. 5 is a perspective view of a cover member according to the same embodiment.
Figure 6:
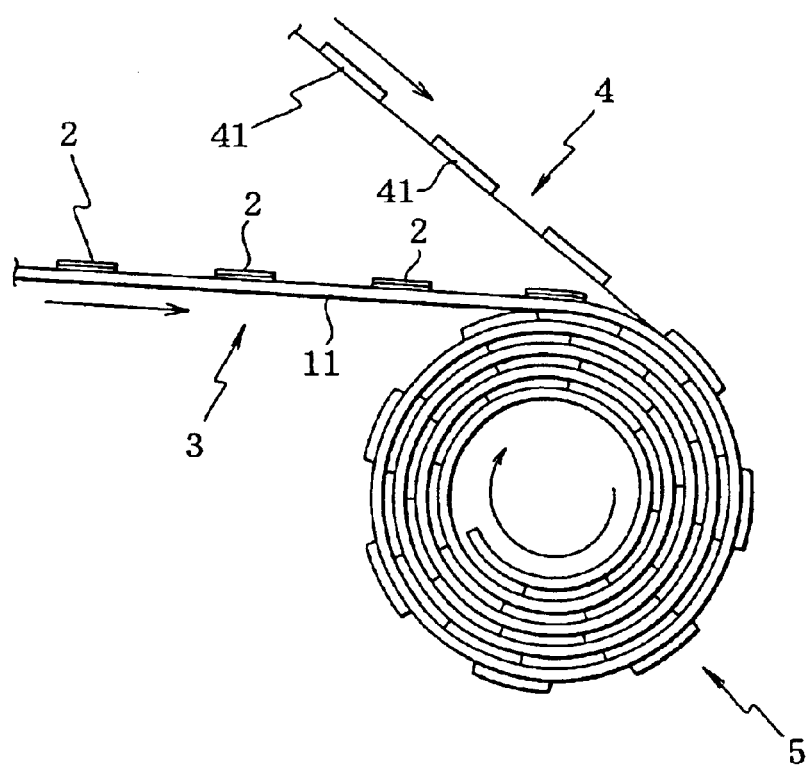
FIG. 6 is a schematic side view when adhering the semiconductor chip carrier and the cover member according to the same embodiment.
Figure 7:
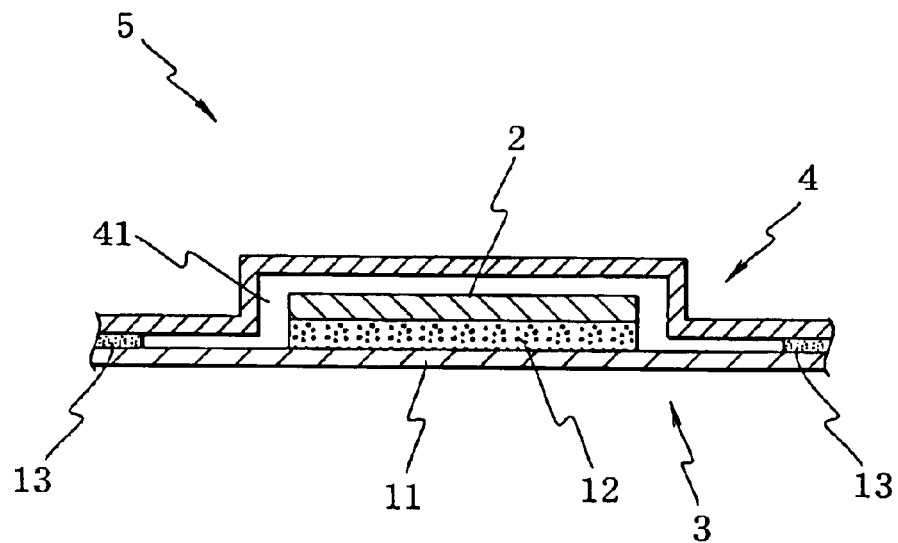
FIG. 7 is a schematic sectional view of a state where the semiconductor chip carrier and the cover member according to the same embodiment are adhered.

FIG. 1 is a perspective view of a semiconductor chip carrying adhesive tape according to a first embodiment of the present invention, FIG. 2 is an overall perspective view of the semiconductor chip carrying adhesive tape according to the same embodiment, FIG. 3 is a schematic side view when sticking the semiconductor chip carrying adhesive tape according to the same embodiment and a semiconductor chip, FIG. 4 is a perspective view of a semiconductor chip carrier according to the same embodiment, FIG. 5 is a perspective view of a cover member according to the same embodiment, FIG. 6 is a schematic side view when adhering the semiconductor chip and the cover member carrier according to the same embodiment, and FIG. 7 is a schematic sectional view of a state where the semiconductor chip carrier and the cover member according to the same embodiment are adhered.

Semiconductor Chip Carrying Adhesive Tape 1

As shown in FIG. 1, a semiconductor chip carrying adhesive tape 1 according to a first embodiment of the present invention comprises a base material 11, a plurality of adhesive agent portions 12 for adhering to a semiconductor chip intermittently formed in the longitudinal direction of the base material 11, and adhesive agent portions 13 for adhering a cover member formed at both end portions of the base material 11.

Adhesive Agent Portion 12

The adhesive agent portion 12 is made to have a substantially identical shape with that of a semiconductor chip to be adhered or a slightly larger shape than that of the semiconductor chip to be adhered, preferably, to have an identical shape with that of the semiconductor chip. When the adhesive agent portion 12 is smaller than the semiconductor chip to be adhered, a space is formed in the semiconductor device when being encapsulated and reliability of the semiconductor device to be obtained declines. On the other hand, when the adhesive agent portion 12 is too large, the semiconductor device cannot be made compact.

A thickness of the adhesive agent portion 12 is normally 3 to 200 $\mu$m, preferably 5 to 100 $\mu$m.

The adhesive agent portion 12 is comprised of an adhesive agent having gradable adhesiveness. The adhesive agents which exhibit gradable adhesiveness include those having a stage of tackiness (removable adhesiveness) and a stage of adhesiveness (a so-called tacky adhesive agent) and also include those which do not exhibit any tackiness/adhesiveness in a normal state but exhibit gradable tackiness/adhesiveness by a heat, compression or other triggers.

An adhesive agent (tacky adhesive agent) of the former type may be, for example, a composition (a) containing a thermosetting resin and a tacky component, while an adhesive agent of the latter type may be, for example, a polyimide type resin (b) and an epoxy type resin (c), etc. The resins or the resin compositions may be used alone, or a material wherein the resin or the resin composition is used as a matrix can be also used.

a. Composition Containing Thermosetting Resin and Tacky Component

In a composition containing a thermosetting resin and an tacky component, mainly the thermosetting resin exhibits adhesiveness and the tacky component exhibits tackiness. Examples of the thermosetting resin in such a composition include an epoxy resin, a phenol resin, an urea resin, a melanin resin, an unsaturated polyester resin, a resorcinol resin, a furan resin, a polyurethane resin, a silicone resin etc. An epoxy resin is preferable among them. On the other hand, examples of the tacky component include an acrylic type adhesive, a rubber type adhesive, a polyester type adhesive, or thermoplastic resins such as polyolefin, polyvinyl chloride, polystyrene, thermoplastic polyamide and polyester. A photopolymerizable composition may be included therein. As such a tacky component, a (meth)acrylate copolymer is preferable.

Particularly preferable composition containing a thermoplastic resin and a tacky component is a composition (hereinafter, also referred to as "composition A") containing a (meth)acrylate copolymer having a weight-average molecular weight of not less than 30000, an epoxy resin having a weight-average molecular weight of 100 to 10000, a photopolymerizable low molecular compound and thermal activation latent epoxy resin curing agent.

The (meth)acrylate copolymer having a weight-average molecular weight of not less than 30000 may be a copolymer obtained by copolymerizing monomers, such as, (meth) acrylic acid, for example, alkyl (meth)acrylate derived from (meth)acrylic acid and alcohol having a carbon number of 1 to 14, hydroxyethyl (meth)acrylate, glycidyl (meth)acrylate, etc. A copolymer of (meth)acrylic acid and/or glycidyl (meth)acrylic acid and at least one kind of alkyl (meth) acrylate is preferable among them.

Examples of alkyl (meth)acrylate derived from (meth) acrylic acid and alcohol having a carbon number of 1 to 14 include methyl (meth) acrylate, ethyl (meth) acrylate, butyl (meth)acrylate, etc.

When using a copolymer derived from (meth) acrylic acid and/or glycidyl (meth)acrylic acid as a (meth)acrylate copolymer, a content of a component unit derived from glycidyl (meth) acrylic acid in the copolymer is normally made to be 0 to 80 mol %, preferably 5 to 50 mol %, and a content of a component unit derived from (meth)acrylic acid is normally made to be 0 to 40 mol %, preferably 5 to 20 mol %. In this case, as monomer components other than (meth) acrylic acid and glycidyl (meth)acrylic acid constituting (meth)acrylate copolymer, it is preferable to use alkyl (meth) acrylate, such as, methyl (meth)acrylate, ethyl (meth) acrylate, butyl (meth)acrylate, etc.

An epoxy resin having a weight-average molecular weight of 100 to 10000 may be glycidyl ether of a phenol series, such as, bisphenol A, bisphenol F, resorcinol, phenyl novolac, cresol novolac; glycidyl ether of an alcohol series, such as, butanediol, polyethylene glycol, polypropylene glycol; glycidyl ether of carboxylic acid, such as, phthalic acid, isophthalic acid, tetrahydro phthalic acid; a glycidyl type or alkyl glycidyl type epoxy resin obtained by substituting active hydrogen bonded with nitrogen atom, such as aniline isocyanurate, with a glycidyl group; and so-called alicycle epoxide wherein an epoxy group is introduced by, for example, oxidizing carbon-carbon double bond in molecular, such as, vinyl cyclohexene epoxide, 3,4-epoxy cyclohexyl methyl-3,4-dicyclohexane carboxylate, 2-(3,4-epoxy) cyclohexyl-5,5-spiro (3,4-epoxy) cyclohexane-m-dioxane, etc.

An epoxy equivalent weight of the above epoxy resins is preferably 50 to 5000 g/eq. The above epoxy resins may be used alone or by combining different kinds. Among these epoxy resins, bisphenol series glycidyl type epoxy resin, o-cresol novolac type epoxy resin and phenol novolac type epoxy resin are preferably used.

The above epoxy resins are used in an amount of a range of normally 5 to 2000 parts by weight, preferably 100 to 1000 parts by weight with respect to 100 parts by weight of (meth)acrylate copolymer.

A photopolymerizable low molecular compound is a compoundable to be crosslinked by being irradiated an energy rays, such as, ultraviolet rays, electron rays, etc. As such a compound, oligomer wherein there is at least one photopolymerizable double bond in molecular and a weight-average molecular weight (Mw) is in a range of 100 to 30000, preferably 300 to 10000 may be used.

Example of a photopolymerizable low molecular compound may be urethane modified acrylate, epoxy modified acrylate, polyester acrylate, polyether acrylate; (meth) acrylic acid oligomer, itaconic acid oligomer and other oligomers having a functional group, such as hydroxy group or carboxyl group. Epoxy modified acrylate and urethane modified acrylate are preferably used among these.

Note that different points between the above photopolymerizable low molecular compound and the above (meth) acrylate copolymer or an epoxy resin are that an upper limit of a weight-average molecular weight of the photopolymerizable low molecular compound is 30000 while that of the above (meth)acrylate copolymer is not less than 30000, and that the photopolymerizable low molecular compound always has at least one photopolymerizable double bond in its molecular while the above (meth)acrylate copolymer and epoxy resin normally do not have photopolymerizable double bond.

The above photopolymerizable low molecular compound is used in an amount of a range of normally 10 to 1000 parts by weight, preferably 50 to 600 parts by weight with respect to 100 parts by weight of (meth)acrylate copolymer.

When using ultraviolet rays for crosslinking the above photopolymerizable low molecular compound, it is preferable that a photopolymerizing initiator is blended in the composition A. A photopolymerizing initiator may be benzophenone, acetophenone, benzoin, benzoin alkyl ether, benzil, benzil dimethyl ketal, etc. These photopolymerizing initiators may be used alone or by combining different kinds. It is preferable to use α-substituted acetophenone among these.

The above photopolymerizing initiator is used in an amount of a range of normally 0.1 to 10 parts by weight, preferably 1 to 5 parts by weight with respect to 100 parts by weight of a photopolymerizable low molecular compound.

A thermal activation latent epoxy resin curing agent is a curing agent of a type that does not react with epoxy resins at a room temperature but activates by a heat of a certain temperature or more and reacts with epoxy resins. As kinds (divided by activation processes) of thermal activation latent epoxy resin curing agents, there are those which generate active species (anion, cation) by a chemical reaction due to heating, those which are stably dispersed in an epoxy resin around a room temperature but become compatible and dissolved in an epoxy resin at a high temperature to start a curing reaction, those which are a type of curing agent contained in molecular sieves which is released at a high temperature to start a curing reaction, and those encapsulated in a micro-capsule, etc. These thermal activation latent epoxy resin curing agents can be used alone or by combining different kinds, and among these, it is preferable to use dicyanamide, imidazole compound, or a mixture of the dicyanamide and imidazole compound.

The above thermal activation latent epoxy resin curing agents are used in an amount of a range of normally 0.1 to 40 parts by weight, preferably 1 to 30 parts by weight with respect to 100 parts by weight of an epoxy resin.

Note that a thermo-curing agent, such as polyisocyanate compound, other than the above thermal activation latent epoxy resin curing agents may be blended so as to change an adhesion ability of the compound A. The thermo-curing agent is used in an amount of a range of normally 0.1 to 30 parts by weight, preferably 5 to 20 parts by weight with respect to 100 parts by weight of (meth)acrylate copolymer.

b. Polyimide Type Resin

Examples of a polyimide type resin include a polyimide resin, a polyisoimide resin, maleimide resin, a bismaleimide resin, a polyamide-imide resin, a polyetherimide resin, a poly-imide-isoindoloquinazolinedioneimide resin, etc. These polyimide type resins may be used alone or by combining different kinds. It is preferable to use a polyimide resin among these. Furthermore, in polyimide resins, there are thermoplastic polyimide resins which do not have a reactive functional group and thermoplastic polyimide resins which show an imidation reaction by heating. Any of these may be used or the both may be mixed to be used.

A weight-average molecular weight of polyimide type resins is preferably about 10,000 to 1,000,000, particularly about 50,000 to 100,000.

c. Epoxy Type Resin

As an epoxy type resin, those similar to the epoxy resins of the above composition A may be used. The weight-average molecular weight is preferably about 100 to 100,000.

The above resins or resin compositions may be blended additives, such as, a leuco dye, an antistatic agent, a coupling agent, an ion scavenger and a copper inhibitor, and other polymers, oligomers and low molecular compounds, etc.

As a leuco dye, 3-[N-(P-tolylamino)-7-anilinofluoran, 4,4',4"-trisdimethylamino triphenylmethane, etc. may be used, and as an antistatic agent, carbon black, anion type and cation type surface-active agents, etc. may be used.

Also, other polymers, oligomers and low molecular compounds may be, for example, a variety of polymers or oligomers, such as, an epoxy resin, an amide resin, an urethane resin, an amide acid resin, a silicone resin, an acrylic resin and acrylic rubber; and nitrogen-contained organic compounds, such as, triethanolamine, α, ω-(bis3-aminopropyl) polyethylene glycol ether.

Also, the adhesive agent portion 12 may contain an inorganic filler, conductive material, etc. other than an adhesive agent as a matrix.

An inorganic filler may be a fused silica, crystal silica, alumina, boron nitride, aluminum nitride, silicon nitride, magnesia, magnesium silicate, etc. Note that when filling up the above composition A with a light scattering inorganic filler, such as silica powder and alumina powder, a photopolymerizable low molecular compound in the composition A can be efficiently polymerized by irradiating a light.

Examples of the conductive material include particles made of a metal having an excellent conductivity, such as Ni, Ag, Au, Cu and solder, polymer particles covered with these metals, or carbon, etc. When giving conductivity to the adhesive agent portion 12, normally 50 to 95 parts by weight of conductive materials are blended with respect to 100 parts by weight of an adhesive agent.

The adhesive agent portion 12 explained above can be formed by a method of coating an adhesive agent to a base material 11 to have a predetermined shape (a substantially identical shape with that of a semiconductor chip to be adhered or a shape slightly larger than that of the semiconductor chip) by screen process printing, or by a method of coating the adhesive agent by roller printing, gravure printing, or micro-die method, etc., and then processing the adhesive agent layer to have the above predetermined shape.

Note that when preparing and coating the above adhesive agent, a solvent wherein respective components of the adhesive agent can be uniformly dissolved and dispersed can be also used. The solvent is not particularly limited as far as it is capable of uniformly dissolving and dispersing the respective components therein. Examples of the solvent include dimethylformamide, dimethylacetamide, N-methyl-pyrrolidone, dimethyl sulfoxide, diethylene glycol dimethyl ether, toluene, benzene, xylene, methyl ethyl ketone, tetrahydrofuran, ethyl-Cellosolve, dioxane, cyclopentanone, cyclohexanone, monoglyme, etc. These solvents can be used alone or by being mixed with different kinds.

Base Material 11

Any material would be basically sufficient as a base material 11 in the present embodiment as far as it supports the adhesive agent portion 12 and is able to be removed from the adhesive agent portion 12, and it may also have stiffness.

Examples of the base material 11 include films made by resins, such as, polyethylene, polypropylene, polybutene, polybutadiene, vinyl chloride, ionomer, ethylene-methacrylic acid copolymer, polyethylene terephthalate, polyethylene naphthalate, polybutylene terephthalate, polyimide, polyetherimide, polyaramide, polyetherketone, polyether ether ketone, polyphenylene sulfide, poly (4-methylpentene-1), polytetrafluoroethylene, and those obtained by crosslinking these resins. These films may be used alone or by laminating different kinds. A film thickness thereof is normally about 5 to 300 μm, preferably 20 to 100 μm.

Also, other than the above films, papers, such as, a glassine paper, clay coated paper, resin coated paper, a laminated paper (polyethylene laminated paper, polypropylene laminated paper, etc.) or nonwoven fabrics, metallic foils, etc. may be used.

A surface tension of a surface of the base material ii on which the adhesive agent portion 12 is formed is preferably not more than 40 dyne/cm. Release treating may be performed on the surface of the base material 11 on which the adhesive agent portion 12 is formed to adjust the surface tension to be a preferable value. Alkyd resin type, silicone resin type, fluorine resin type, unsaturated polyester resin type, polyolefin resin type and wax type releasing agents, etc. may be used for the release treating. Note that when the base material 11 itself has the above surface tension, the base material 11 can be used as it is without any release treating.

When using the above composition A for the adhesive agent portion 12, it is preferable to use as the base material 11 a material wherein an energy rays to be irradiated on the composition A can permeate, and it is particularly preferable to use a material having a low adhesiveness to the composition A having improved tackiness due to the energy rays irradiation.

On the other hand, when a polyimide type resin or an epoxy type resin is used for the adhesive agent portion 12, it is preferable to use as the base material 11 a film made of a heat resistance resin. A fusing point of the heat resistance resin is preferably not less than 230° C., more preferably 250 to 300° C., and particularly preferably 260 to 280° C.

Adhesive Agent Portion 13

A form of an adhesive agent portion 13 is not particularly limited as far as it is formed not to contact the adhesive agent portion 12 for adhering the above semiconductor chip. The adhesive agent portion 13 in the present embodiment is linearly formed at the both end portions of the base material 11, but the form of the adhesive agent portion 13 may be an intermittent linear shape or dots. A thickness of the adhesive agent portion 13 is normally 5 to 50 μm, preferably 10 to 30 μm.

As an adhesive agent constituting the adhesive agent portion 13, a variety of adhesive agents are used, such as, an acrylic type, rubber type, silicone type adhesive agents, etc., a pressure-sensitive adhesive agent or a hot melt type adhesive agent.

The adhesive agent portion 13 can be formed by coating an adhesive agent on the base material 11 by screen process printing, roller printing, gravure printing, micro-die, dispenser, etc. The adhesive agent may be coated by being dissolved or dispersed in a solvent in accordance with need.

Note that a semiconductor chip carrying adhesive tape 1 in the present embodiment has an adhesive agent portion 13 for adhering a cover member, but when a cover member is not used, for example, when mounting a semiconductor chip stuck on the semiconductor chip carrying adhesive tape 1 directly on a lead frame, the adhesive agent portion 13 is not necessary. Also, even when a cover member is used, the adhesive agent portion 13 on the semiconductor chip carrying adhesive tape 1 side becomes unnecessary if an adhesive agent portion is formed on the cover member side.

Furthermore, when the semiconductor chip carrying adhesive tape 1 and the cover member are fusion bonded by heating, the adhesive agent portion 13 is unnecessary.

Wound body of Semiconductor Chip Carrying Adhesive Tape 1

As shown in FIG. 2, the above semiconductor chip carrying adhesive tape 1 may be wound to be a wound body. When the semiconductor chip carrying adhesive tape 1 is wound to be a wound body, storage and transportation thereof become convenient and it can be also automatically taken out.

When the semiconductor chip carrying adhesive tape 1 is made to be a wound body, a release film may be stuck on the surface of the semiconductor chip carrying adhesive tape 1, so that the adhesive agent portion 12 for adhering the semiconductor chip or the adhesive agent portion 13 for adhering the cover member does not adhere to the back surface of the base material 11. As the release film, for example, films being coated a release agent, such as a silicone type resin, a fluorine type resin or a long chain alkyl type resin, and a fluorine type resin film may be used.

Semiconductor Chip Carrier 3

As shown in FIG. 4, a semiconductor chip carrier 3 according to the present embodiment is obtained by sticking a semiconductor chip 2 to the adhesive agent portion 12 of the above semiconductor chip carrying adhesive tape 1.

A method of sticking the semiconductor chip 2 to the adhesive agent portion 12 of the semiconductor chip carrying adhesive tape 1 is not particularly limited. For example, a method below may be performed.

Namely, as shown in FIG. 3, the semiconductor chip carrying adhesive tape 1 with its adhesive agent portion 12 facing downward is moved in the longitudinal direction of the tape so as to be a linear state from an arc state. Such an operation can be attained for example by winding the semiconductor chip carrying adhesive tape 1 while taking it out from the wound body of the semiconductor chip carrying adhesive tape 1. At the same time, semiconductor chips 2 are placed at predetermined intervals on a conveyor and the conveyor is moved in accordance with the above semiconductor chip carrying adhesive tape 1.

At this time, a positional relationship of the conveyor and the semiconductor chip carrying adhesive tape 1 is adjusted so that the semiconductor chip 2 and the adhesive agent portion 12 of the semiconductor chip carrying adhesive tape 1 in a linear state touch or contact with pressure. Also, the intervals between the semiconductor chips 2 placed on the conveyor and a moving speed of the conveyor are suitably adjusted so that each of the semiconductor chips 2 is stuck to each of the adhesive agent portions 12.

According to the above method, the semiconductor chips 2 can be successively and efficiently stuck to the adhesive agent portions 12 of the semiconductor chip carrying adhesive tape 1.

Incidentally, when the adhesive agent portion 12 of the semiconductor chip carrying adhesive tape 1 has tackiness, the above sticking can be attained by an adhesion force of the tackiness. When the adhesive agent portion 12 of the semiconductor chip carrying adhesive tape 1 does not have any tackiness, it is preferable to stick the adhesive agent portion 12 and the semiconductor chip 2 by hot pressing. The heating temperature of the hot pressing is preferably about 30 to 300° C., particularly preferably about 50 to 200° C., the heating time is preferably about 1 second to 10 minutes, particularly preferably about 1 to 30 seconds, and the pressure is preferably about 1 to 10 kg/cm$^2$, particularly preferably about 1 to 5 kg/cm$^2$.

Since only non-defective semiconductor chips 2 can be stuck to the adhesive agent portions 12 in the above semiconductor chip carrying adhesive tape 1 or the semiconductor chip carrier 3, the yield of the semiconductor chips 2 attached with the adhesive agent portion 12 to be mounted on a lead frame can be improved and a wasteful use of the adhesive agent can be prevented. Particularly, when the adhesive agent portion 12 contains a conductive material made of a precious metal, such as Ag powder, costs for the adhesive agent can be considerably reduced comparing with the case of sticking the adhesive agent portion 12 to an overall surface of the semiconductor wafer.

Also, since the adhesive agent portion 12 formed on the base material 11 is formed in substantially identical shape with that of a semiconductor chip 2 to be adhered or a slightly larger shape than that of the semiconductor chip 2 to be adhered, there is an advantage that cutting of the adhesive agent portion 12 is unnecessary.

Mounting of Semiconductor Chip 2

A semiconductor chip 2 can be directly put on a lead frame from the above semiconductor chip carrier 3. Specifically, first, the semiconductor chip 2 together with an adhesive agent portion 12 is picked up (a semiconductor chip 2 attached with an adhesive agent portion 12 is picked up) from the base material 11 of the semiconductor chip carrier 3 and put on an island portion of the lead frame with the adhesive agent portion 12 facing downward.

Incidentally, when the above composition A is used for the adhesive agent portion 12 of the semiconductor chip carrying adhesive tape 1, it is preferable that energy rays is irradiated to the adhesive agent portion 12 from the base material 11 side of the semiconductor chip carrying adhesive tape 1 before picking up the semiconductor chip 2 attached with the adhesive agent portion 12. As the energy rays, ultraviolet rays having a center wavelength of about 365 nm and electron rays, etc. may be used.

When using ultraviolet rays as the energy rays, normally, the illuminance is set in a range of 20 to 500 mW/cm$^2$ and the irradiation time is set in a range of 0.1 to 150 seconds. Also, for example when using electron rays, conditions can be set conforming to the case of ultraviolet rays. Note that heating may be also auxiliary performed at the time of irradiating the above energy rays.

By irradiating energy rays as such, an adhesion force between the semiconductor chip 2 and the adhesive agent portion 12 is normally improved to 50 to 4000 g/25 mm, preferably 100 to 3000 g/25 mm. On the other hand, an adhesion force between the adhesive agent portion 12 and the base material 11 normally declines to 1 to 500 g/25 mm, preferably 100 g/25 mm or less. Therefore, the adhesive agent portion 12 can be surely removed from the base material 11 while adhering the adhesive agent portion 12 to the semiconductor chip 2 side.

The semiconductor chip 2 is firmly adhered to the lead frame via the adhesive agent portion 12. The adhering process can be performed generally by heating. The heating is preferably performed at the time of putting the semiconductor chip 2 on the lead frame or immediately after the putting. At this time, when the adhesive agent portion 12 does not have any tackiness, a temporary adhesion is preferably performed before an actual adhesion.

A heating temperature of the temporary adhesion is normally 100 to 300° C., preferably 150 to 250° C., a heating time is normally 1 second to 10 minutes, preferably 1 to 30 seconds, while a heating temperature of the actual adhesion is normally 100 to 300° C., preferably 150 to 250° C. and a heating time is normally 1 to 120 minutes, preferably 1 to 60 minutes. By heating in this way, an adhesive agent of the adhesive agent portion 12 is fused or hardened so that the semiconductor chip 2 (or a semiconductor chip) and the lead frame are firmly adhered.

During the above heating, the semiconductor chip 2 and the lead frame may be pressed to adhere by applying a suitable pressure in the thickness direction of a laminate formed by the semiconductor chip 2, the adhesive agent portion 12, and the lead frame.

Semiconductor Chip Packaging Body 5

When storing or transporting the above semiconductor chip carrier 3, a cover member 4 as shown in FIG. 5 can be adhered to the semiconductor chip carrier 3 to obtain a semiconductor chip packaging body 5 as shown in FIG. 7.

The cover member 4 shown in FIG. 5 is continuous having a width and length corresponding to the above semiconductor chip carrier 3, wherein a plurality of rectangular concave portions intermittently formed in the longitudinal direction of the cover member 4 constitute chip housings 41. The chip housings 41 are formed to be larger than the semiconductor chip 2 attached with the adhesive agent portion 12 in the above semiconductor chip carrier 3 so as to be able to house the semiconductor chip 2 attached with the adhesive agent portion 12 therein.

As a material of the cover member 4, those having a certain degree of stiffness are normally preferable. Such a material may be, for example, paper; plastics, such as, polyethylene, polypropylene, a vinyl chloride type resin, a polystyrene resin, polycarbonate, polyethylene terephthalate, polyacrylonitrile, etc. Note that the plastics may be filled with carbon, etc. for giving an antistatic property.

A method of adhering the cover member 4 to the semiconductor chip carrier 3 is not particularly limited. For example, as shown in FIG. 6, a method of winding the semiconductor chip carrier 3 pulled out from a certain direction and the cover member 4 pulled out from a different direction while adhering them at a time can be applied. At this time, it is necessary to align the semiconductor chip carrier 3 with the cover member 4 so that the semiconductor chips 2 attached with adhesive agent portions 12 on the semiconductor chip carrier 3 can be housed in the chip housings 41 on the cover member 4. According to the method, a wound body of the semiconductor chip packaging body 5 can be effectively obtained.

In the semiconductor chip packaging body 5 obtained as above, as shown in FIG. 7, the base material 11 of the semiconductor chip carrier 3 and the cover member 4 are adhered via the adhesive agent portion 13, and the adhesive agent portions 12 formed on the base material 11 of the semiconductor chip carrier 3 and the semiconductor chips 2 are housed in the chip housings 41 of the cover member 4. Such a semiconductor chip packaging body 5 is suitable for storing and transporting a semiconductor chip carrier 3 (a semiconductor chip 2 attached with an adhesive agent portion 12).

Second Embodiment

Figure 8:
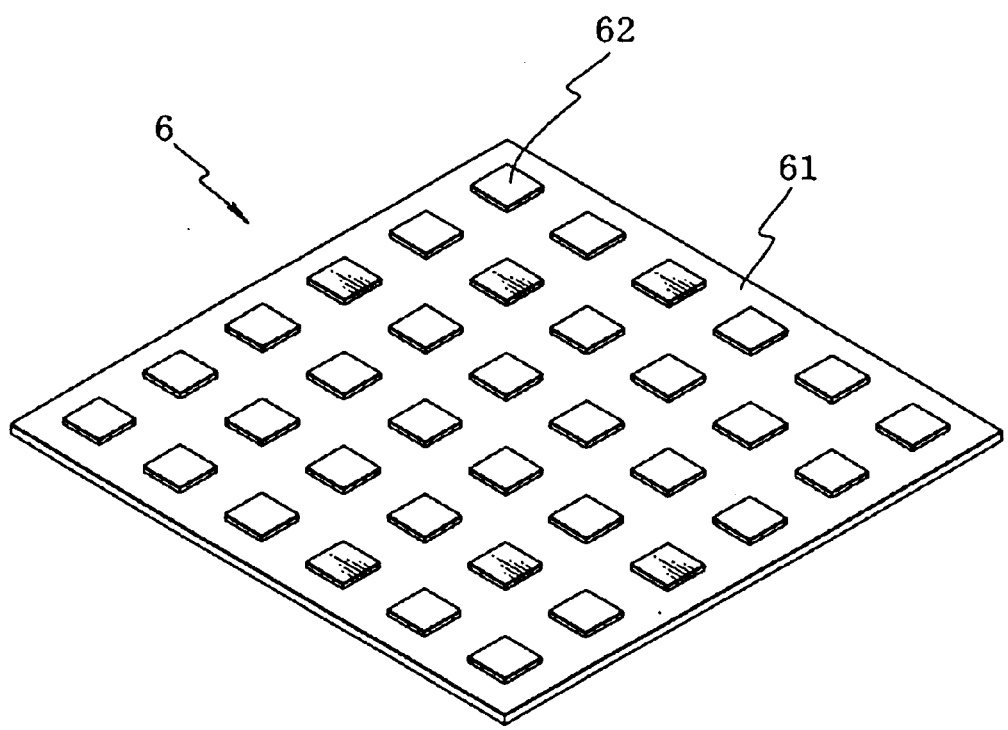
FIG. 8 is a perspective view of a semiconductor chip carrying adhesive sheet according to another embodiment of the present invention.
Figure 9:
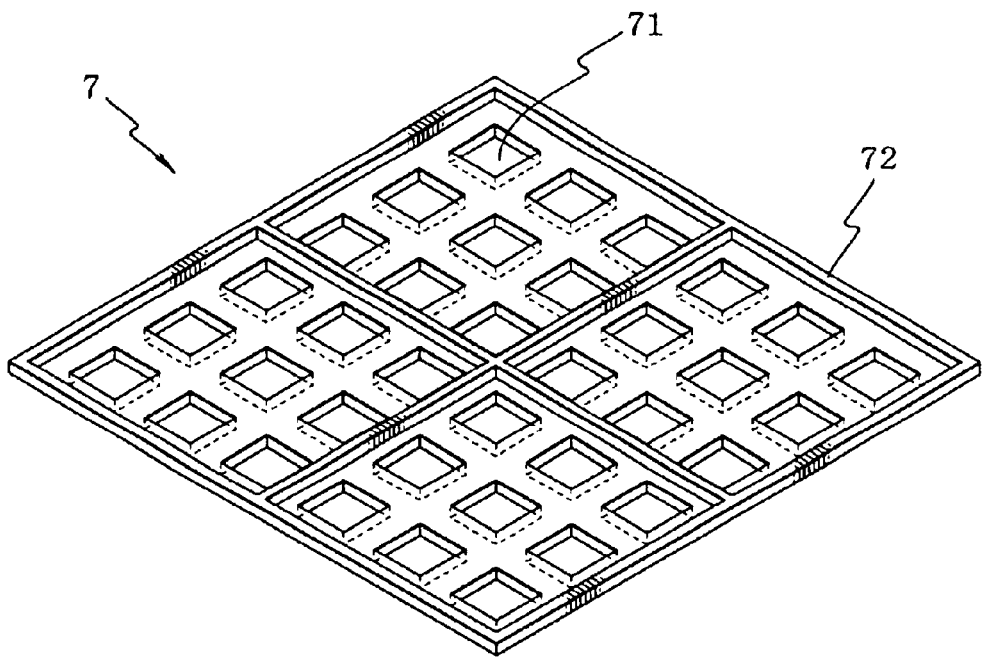
FIG. 9 is a perspective view of a cover member according to the same embodiment.
Figure 10:
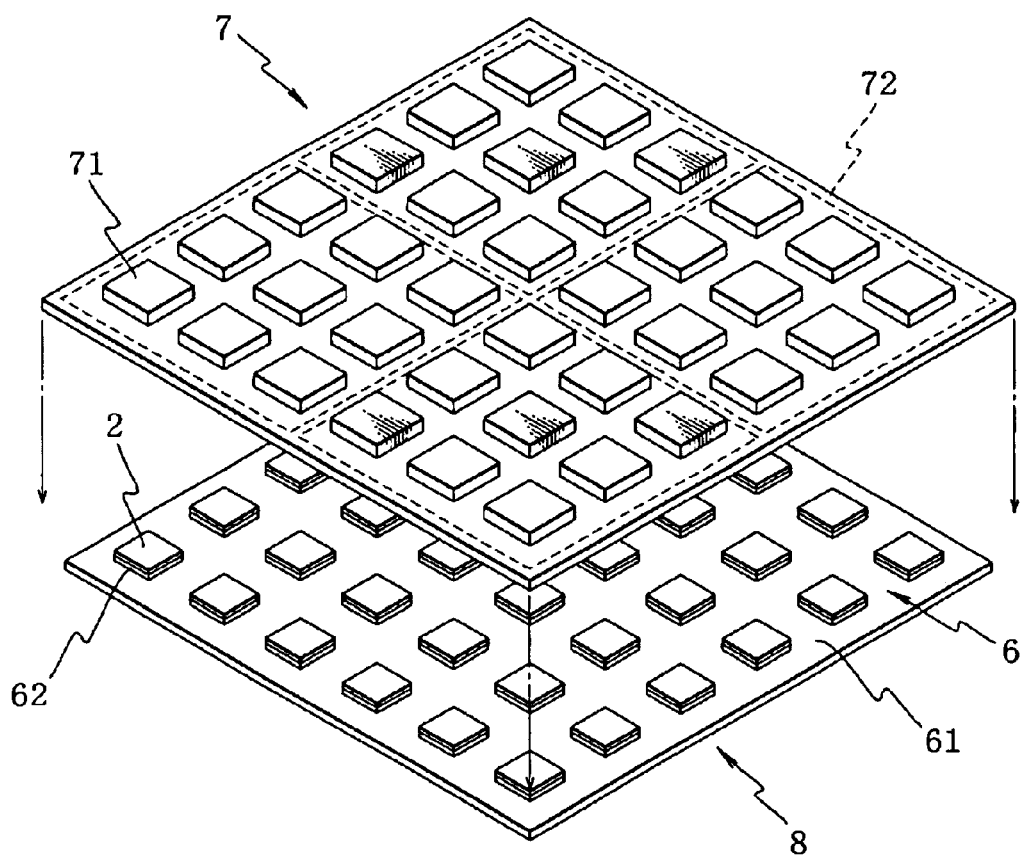
FIG. 10 is a schematic perspective view of when adhering the semiconductor chip and the cover member carrier according to the same embodiment.

A semiconductor chip carrying adhesive sheet according to a second embodiment will be explained. FIG. 8 is a perspective view of a semiconductor chip carrying adhesive sheet according to the second embodiment of the present invention, FIG. 9 is a perspective view of a cover member according to the same embodiment, and FIG. 10 is a schematic perspective view of when adhering the semiconductor chip carrier and the cover member according to the same embodiment.

As shown in FIG. 8, the semiconductor chip carrying adhesive sheet 6 in the present embodiment comprises a base material 61, and a plurality of adhesive agent portions 62 formed in an orderly line on the base material 61 for adhering semiconductor chips. In the present embodiment, the adhesive agent portions 62 are formed in 6 rows×6 columns on the base material 61, but it is not limited to this arrangement.

A material to be used for the semiconductor chip carrying adhesive sheet 6 is basically the same as that in the above semiconductor chip carrying adhesive tape 1. A thickness of the base material 61 is preferably about 5 to 300 μm, particularly preferably 20 to 100 μm.

Note that in the present embodiment, an adhesive agent portion for adhering a cover member is not formed on the base material 61 of the semiconductor chip carrying adhesive sheet 6, but an adhesive agent portion for adhering a cover member may be formed at a predetermined position as far as it does not contact an adhesive agent portion 62 for adhering the above semiconductor chip.

A semiconductor chip carrier can be obtained by sticking a semiconductor chip 2 to the adhesive agent portion 62 of the above semiconductor chip carrying adhesive sheet 6 in a similar way to in the above semiconductor chip carrying adhesive tape 1. The semiconductor chip 2 can be directly mounted on a lead frame from the semiconductor chip carrier, and also, as shown in FIG. 10, a cover member 7 maybe adhered to the semiconductor chip carrier 8 for storage and transportation of the semiconductor chip carrier 8 (a semiconductor chip 2 attached with an adhesive agent portion 62).

As the cover member 7, for example, one as shown in FIG. 9 can be used. The cover member 7 is tray shaped, has a width and length corresponding to a size of the above semiconductor chip carrier 8, and has a plurality of rectangular concave portions (6 rows×6 columns) formed in an orderly line to constitute chip housings 71 thereon.

Adhesive agent portions 72 for adhering the semiconductor chip carrier 8 are formed on a peripheral portion, a center line portion in the lengthwise direction and a center line portion in the crosswise direction of the cover member 7 in the present embodiment, but the positions on which the adhesive agent portions 72 are formed are not particularly limited as far as the adhesive agent portion 72 does not get into the chip housings 71. Also, the adhesive agent portion 72 is not necessarily formed on the cover member 7 side if an adhesive agent portion for adhering the cover member 7 is formed on the base material 61 of the semiconductor chip carrier 8.

The embodiments explained above are described for easier understanding of the present invention and not to limit the present invention. Accordingly, elements disclosed in the above embodiments include all design modifications and equivalents belonging to the scope of the present invention.

According to the semiconductor chip carrying adhesive tape, sheet or a semiconductor chip carrier of the present invention, the yield of an adhesive agent attached semiconductor chip can be improved and a wasteful use of the adhesive agent can be prevented. Namely, the present invention is useful for mounting a semiconductor chip on a lead frame at a low cost.

EXAMPLES

Below, the present invention will be explained further in detail by examples, but the scope of the present invention is not limited to the examples.

Example 1

Production of Semiconductor Chip Carrying Adhesive Tape (Adhesive Agent: Composition A)

A copolymer having an weight average molecular weight of 900,000 was prepared by copolymerizing 55 parts by weight of butyl acrylate, 10 parts by weight of methyl methacrylate, 20 parts by weight of glycidyl methacrylate and 15 parts by weight of 2-hydroxyethyl acrylate.

A composition A was obtained by mixing 10 parts by weight of the above copolymer, 24 parts by weight of liquid bisphenol A type epoxy resin (Epikote 828 produced by Yuka Shell Epoxy Co., Ltd), 10 parts by weight of o-cresol novolac type epoxy resin (EOCN-104S produced by NIPPON KAYAKU Co., Ltd.), 0.05 part by weight of γ-glycidoxypropyltrimethoxysilane as a coupling agent, 1.5 part by weight of dicyandiamide as a thermal activation latent curing agent, 1.5 part by weight of 2-phenyl-4,5-hydroxymethylimidazole, 5 parts by weight of urethane acrylate type oligomer (Seikabeam 14-29B produced by Dainichiseika Color & Chemicals Mfg. Co., Ltd.) as a photopolymerizable low molecular compound, 0.2 part by weight of 1-hydroxycyclohexyl phenyl ketone as a photopolymerization initiator and 1 part by weight of aromatic polyisocyanate (Colonate L produced by Nippon Polyurethane Industry Co., Ltd.) as a crosslinking agent.

A polyethylene terephthalate (PET) tape (thickness: 38 μm, width: 20 mm, surface tension: 34 dyne/cm) one surface of which was releasing treated by a silicone resin was used as a base material, and the above composition A was coated by screen process printing to be a thickness of 20 μm and a size of 10 mm×10 mm at intervals of 10 mm on the releasing treated surface of the base material. Then, the coated composition A was dried at 100° C. for 1 minute to form an adhesive agent portion for adhering a semiconductor chip so that a semiconductor chip carrying adhesive tape (not corresponding to a cover member) was obtained.

On the other hand, 92 parts by weight of butyl acrylate, 4.5 parts by weight of acrylic acid, 0.5 parts by weight of 2-hydroxyethyl acrylate, 3 parts by weight of styrene, 200 parts by weight of ethyl acetate, 0.5 parts by weight of azobisisobutyronitrile were mixed, stirred for 30 minutes in nitrogen atmosphere and then reacted at 60° C. for 8 hours. As a crosslinking agent, 0.2 parts by weight of hexamethylenediisocyanate was added to 100 parts by weight (solid content) of the obtained copolymer and sufficiently stirred to obtain a pressure sensitive adhesive agent for adhering a cover member.

After that, the above pressure sensitive adhesive agent was coated to be a width of 1 mm by micro-die at both end portions of the above base material on a part of the above semiconductor chip carrying adhesive tape so that a semiconductor chip carrying adhesive tape (corresponding to a cover member) was obtained.

Example 2
Production of Semiconductor Chip Carrying Adhesive Tape (Adhesive Agent: Polyimide Type Resin)

A semiconductor chip carrying adhesive tape was made in a similar way to in the example 1 except that a tetrahydrofuran solution (solid content: 20 wt %) of thermoplastic polyimide (Upitite UPA-N221 produced by Ube Industries Ltd.) was used instead of the composition A in the example 1, a polyethylene naphthalate (PEN) film (surface tension: 34 dyne/cm) one surface of which was releasing treated was used instead of the PET film one surface of which was releasing treated in the example 1, and the condition of drying the thermoplastic polyimide was 90° C. for 5 minutes.

Example 3
Production of Semiconductor Chip Carrying Adhesive Tape (Adhesive Agent: Epoxy Type Resin Composition)

An epoxy type resin adhesive agent was prepared by mixing 40 parts by weight of high molecular bisphenol type epoxy resin (Epikote 1010 produced by Yuka Shell Epoxy Co., Ltd), 20 parts by weight of a multifunctional cresol novolac type epoxy resin (EOCN-4600 produced by Nippon Kayaku Co.,Ltd.), 1.5 parts by weight of 2-phenyl-4,5-hydroxymethylimidazole as a thermal activation latent curing agent, and 0.1 part by weight of γ-glycidepropyltrimethoxysilane.

A semiconductor chip carrying adhesive tape was made in a similar way to in the example 1 except for using the above epoxy type resin adhesive agent instead of the composition A in the example 1.

Example 4
Production of Semiconductor Chip Carrying Adhesive Sheet (Adhesive Agent: Composition A)

A PET sheet (thickness: 38 μm, 210 mm×210 mm, surface tension: 34 dyne/cm) one surface of which was releasing treated by a silicone resin was used as a base material, and the above composition A was coated by screen process printing to be a thickness of 20 μm and a size of 10 mm×10mm at intervals of 10 mm (10 rows×10 columns). Then, the coated composition A was dried at 100° C. for 1 minute to form an adhesive agent portion for adhering a semiconductor chip so that a semiconductor chip carrying adhesive sheet was obtained.

Example 5
Production of Semiconductor Chip Carrying Adhesive Sheet (Adhesive Agent: Polyimide Type Resin)

A semiconductor chip carrying adhesive sheet was made in a similar way to in the example 4 except that a tetrahydrofuran solution (solid content: 20 wt %) of thermoplastic polyimide (Upitite UPA-N221 produced by Ube Industries Ltd.) was used instead of the composition A in the example 4, a polyethylene naphthalate (PEN) sheet (surface tension: 34 dyne/cm) one surface of which was releasing treated was used instead of the PET sheet one surface of which was releasing treated in the example 4,and the condition of drying the thermoplastic polyimide was 90° C. for 5 minutes.

Example 6
Production of Semiconductor Chip Carrying Adhesive Sheet (Adhesive Agent: Epoxy Type Resin Composition)

A semiconductor chip carrying adhesive sheet was made in a similar way to in the example 4 except for using the epoxy type resin adhesive agent in the example 3 instead of the composition A in the example 4.

Example 7
Production of Semiconductor Chip Carrier (Tape: Example 1)

Non-defective semiconductor chips were stuck to the adhesive agent portions for adhering the semiconductor chips on the semiconductor chip carrying adhesive tape obtained in the example 1 by a method shown in FIG. 3 to obtain a semiconductor chip carrier.

Example 8
Production of Semiconductor Chip Carrier (Tape: Example 2)

Non-defective semiconductor chips were hot-pressed (180° C., 5 kg/cm$^2$, 30 seconds) to be adhered to the adhesive agent portions for adhering the semiconductor chips on the semiconductor chip carrying adhesive tape obtained in the example 2 by a method shown in FIG. 3 to obtain a semiconductor chip carrier.

Example 9
Production of Semiconductor Chip Carrier (Tape: Example 3)

Non-defective semiconductor chips were hot-pressed (140° C., 5 kg/cm$^2$, 30 seconds) to be adhered to the adhesive agent portions for adhering the semiconductor chips on the semiconductor chip carrying adhesive tape obtained in the example 3 by a method shown in FIG. 3 to obtain a semiconductor chip carrier.

Example 10
Production of Semiconductor Chip Carrier (Sheet: Example 4)

Non-defective semiconductor chips were stuck to the adhesive agent portions for adhering the semiconductor chips on the semiconductor chip carrying adhesive sheet obtained in the example 4 by conventional means to obtain a semiconductor chip carrier.

Example 11
Production of Semiconductor Chip Carrier (Sheet: Example 5)

Non-defective semiconductor chips were hot-pressed (180° C., 5 kg/cm$^2$, 30 seconds) to be adhered to the adhesive agent portions for adhering the semiconductor chips on the semiconductor chip carrying adhesive sheet obtained in the example 5 by conventional means to obtain a semiconductor chip carrier.

Example 12
Production of Semiconductor Chip Carrier (Sheet: Example 6)

Non-defective semiconductor chips were hot-pressed (140° C., 5 kg/cm$^2$, 30 seconds) to be adhered to the adhesive agent portions for adhering the semiconductor chips on the semiconductor chip carrying adhesive sheet obtained in the example 6 by conventional means to obtain a semiconductor chip carrier.

Example 13
Mounting of Semiconductor Chip (Carrier: Example 7, 10)

After irradiating ultraviolet rays (ADWILL RAD-2000 m/8 produced by Lintec Corporation was used. irradiation conditions: luminance of 340 mW/cm$^2$, irradiation time of 6 seconds) to the adhesive agent portions of the semiconductor chip carrier (not corresponding to a cover member) obtained in the example 7 and of the semiconductor chip carrier obtained in the example 10, an adhesive agent portion attached semiconductor chip was picked up and put on an island portion of a lead frame. After temporarily adhering the semiconductor chip and the lead frame at 150° C. and 5 kg/cm$^2$ for 5 seconds, they were furthermore heated at 160° C. for 60 minutes to firmly adhere the semiconductor chip and the lead frame via the above adhesive agent portion.

Example 14
Mounting of Semiconductor Chip (Carrier: Example 8, 11)

An adhesive agent portion attached semiconductor chip was picked up from the semiconductor chip carrier obtained in the example 8 (not corresponding to a cover member) and from the semiconductor chip carrier obtained in the example 11 and put on an island portion of a lead frame. After temporarily adhering the semiconductor chip and the lead frame at 180° C. and 5 kg/cm$^2$ for 10 seconds, they were furthermore heated at 180° C. for 60 minutes to firmly adhere the semiconductor chip and the lead frame via the above adhesive agent portion.

Example 15
Mounting of Semiconductor Chip (Carrier: Example 9, 12)

An adhesive agent portion attached semiconductor chip was picked up from the semiconductor chip carrier obtained in the example 9 (not corresponding to a cover member) and from the semiconductor chip carrier obtained in the example 12 and put on an island portion of a lead frame. After temporarily adhering the semiconductor chip and the lead frame at 180° C. and 5 kg/cm$^2$ for 5 seconds, they were furthermore heated at 180° C. for 60 minutes to firmly adhere the semiconductor chip and the lead frame via the above adhesive agent portion.

Example 16
Production of Semiconductor Chip Packaging Body (Tape)

A cover member was made of polystyrene (thickness: 500 μm, width: 16 mm) by a vacuum forming to form chip housings having a size of 10 mm×10 mm and a depth of 3 mm at intervals of 10 mm on the cover member.

The semiconductor chip carriers (corresponding to a cover member) obtained in the examples 7 to 9 and the above cover member were wound while adhering them by a method shown in FIG. 6 to obtain a semiconductor chip packaging body.

Example 17
Production of Semiconductor Chip Packaging Body (Sheet)

A cover member was made of polystyrene (thickness: 500 μm, 210 mm×210 mm) by a vacuum forming to form chip housings having a size of 10 mm×10 mm and a depth of 3 mm at intervals in 10 mm by 10 rows×10 columns. Also, the pressure sensitive adhesive agent in the example 1 was coated by micro-die on a peripheral portion, a center line portion in the lengthwise direction and a center line portion in the crosswise direction of the cover member to have a width of 1 mm.

The semiconductor chip carrier obtained in the examples 10 to 12 and the above cover member were adhered by conventional means to obtain a semiconductor chip packaging body.

What is claimed is:

1. A semiconductor chip carrying adhesive tape, wherein a plurality of adhesive agent portions are intermittently formed on a surface of a tape shaped base material in a longitudinal direction of said base material in a substantially identical shape with that of a semiconductor chip to be adhered or a slightly larger shape than that of the semiconductor chip to be adhered, the surface of the tape shaped base material on which the plurality of adhesive agents are formed having an associated surface tension of not more than 40 dyne/centimeter, and an adhesive agent constituting said adhesive agent portions having gradable adhesiveness.

2. The semiconductor chip carrying adhesive tape as set forth in claim 1, wherein second adhesive agent portions for adhering a cover member are adhered at both end portions of said tape shaped base material so as not to contact the plurality of adhesive agent portions for adhering said semiconductor chip.

3. A semiconductor chip carrying adhesive tape according to claim 2, wherein a thickness of the second adhesive agent portions is about 5 to 50 μm.

4. A semiconductor chip carrier, which can be obtainable by sticking one or more semiconductor chips each to one of the plurality of adhesive agent portions on the surface of the tape shaped base material on which the plurality of adhesive agents are formed as set forth in claim 1.

5. A semiconductor chip packaging body,
which can be obtainable by adhering the semiconductor chip carrier as set forth in claim 4 and a continuous cover member on which a plurality of chip housings are intermittently formed in the longitudinal direction so that the semiconductor chips on said semiconductor chip carrier are housed in the chip housings on said cover member.

6. A semiconductor chip carrying adhesive tape according to claim 1, wherein a thickness of the adhesive agent portions is about 3 to 200 μm.

7. A semiconductor chip carrying adhesive tape according to claim 1, further comprising a release material applied to the surface of the tape shaped base material on which the plurality of adhesive agents are formed for creating the surface tension of not more than 40 dyne/centimeter.

8. A semiconductor chip carrying adhesive tape according to claim 7, wherein the release material is made from one of an alkyd resin type, a silicone resin type, a fluorine resin type, an unsaturated polyester resin type, a polyolefin resin type, a long chain alkyl resin type and a wax type releasing agent.

9. A semiconductor chip carrying adhesive sheet,
wherein a plurality of adhesive agent portions are formed on a surface of a sheet shaped base material in a substantially identical shape with that of the semiconductor chips to be adhered or a slightly larger shape than the semiconductor chips to be adhered, the surface of the sheet shaped base material on which the plurality of adhesive agents are formed having an associated surface tension of not more than 40 dyne/centimeter, and an adhesive agent constituting said adhesive agent portions having gradable adhesiveness.

10. A semiconductor chip carrier, which can be obtainable by sticking one or more semiconductor chips each to one of the plurality of adhesive agent portions on the surface of the sheet shaped base material on which the plurality of adhesive agents are formed as set forth in claim 9.

11. A semiconductor chip packaging body,
which can be obtainable by adhering the semiconductor chip carrier as set forth in claim 10 and a tray shaped cover member on which a plurality of chip housings are formed so that the semiconductor chips on said semiconductor chip carrier are housed in the chip housings on said cover member.

12. A semiconductor chip carrying adhesive tape according to claim 9, wherein a thickness of the adhesive agent portions is about 3 to 200 μm.

13. A semiconductor chip carrying adhesive tape according to claim 9, further comprising a release material applied to the surface of the sheet shaped base material on which the plurality of adhesive agents are formed for creating the surface tension of not more than 40 dyne/centimeter.

14. A semiconductor chip carrying adhesive tape according to claim 13, wherein the release material is made from one of an alkyd resin type, a silicone resin type, a fluorine resin type, an unsaturated polyester resin type, a polyolefin resin type, a long chain alkyl resin type and a wax type releasing agent.

15. A semiconductor chip packaging body, comprising:
a plurality of semiconductor chips;
a semiconductor chip carrying adhesive tape on which the plurality of semiconductor chips are stuck and that is formed from a tape shaped base material that includes a plurality of adhesive agent portions intermittently formed thereon in a longitudinal direction and in a substantially identical, or slightly larger, shape than that of the plurality of semiconductor chips, wherein an adhesive agent constituting the adhesive agent portions has gradable adhesiveness; and
a continuous cover member including a plurality of chip housings formed in the longitudinal direction for housing the plurality of semiconductor chips.

* * * * *

UNITED STATES PATENT AND TRADEMARK OFFICE
CERTIFICATE OF CORRECTION

PATENT NO.   : 6,753,614 B2
DATED        : June 22, 2004
INVENTOR(S)  : Osamu Yamazaki and Kazuyoshi Ebe It is certified that error appears in the above-identified patent and that said Letters Patent is hereby corrected as shown below:

<u>Title page,</u>
Item [75], Inventors, should read -- Osamu Yamazaki, Saitama (JP);
                                     Kazuyoshi Ebe, Shiraoka-machi (JP) --

Signed and Sealed this

Twenty-first Day of December, 2004

JON W. DUDAS
*Director of the United States Patent and Trademark Office*